(12) United States Patent
Chen et al.

(10) Patent No.: US 9,755,669 B2
(45) Date of Patent: Sep. 5, 2017

(54) VARIATION CALIBRATION FOR ENVELOPE TRACKING ON CHIP

(71) Applicant: MediaTek Inc., Hsinchu (TW)

(72) Inventors: Yen-Liang Chen, Taipei (TW); Chia-Sheng Peng, Taichung (TW); Da-Wei Sung, Hsinchu County (TW)

(73) Assignee: MEDIATEK INC., Hsin-Chu (TW)

(*) Notice: Subject to any disclaimer, the term of this patent is extended or adjusted under 35 U.S.C. 154(b) by 0 days.

(21) Appl. No.: 15/250,920

(22) Filed: Aug. 30, 2016

(65) Prior Publication Data
US 2016/0373142 A1 Dec. 22, 2016

Related U.S. Application Data

(60) Provisional application No. 62/212,816, filed on Sep. 1, 2015.

(51) Int. Cl.
| | |
|---|---|
| *H04B 17/00* | (2015.01) |
| *H04B 1/04* | (2006.01) |
| *G01R 19/04* | (2006.01) |
| *G01R 31/28* | (2006.01) |
| *H03F 1/32* | (2006.01) |
| *H03F 1/02* | (2006.01) |
| *H03F 3/195* | (2006.01) |
| *H03F 3/24* | (2006.01) |

(52) U.S. Cl.
CPC .............. *H04B 1/04* (2013.01); *G01R 19/04* (2013.01); *G01R 31/2851* (2013.01); *H03F 1/0216* (2013.01); *H03F 1/3241* (2013.01); *H03F 3/195* (2013.01); *H03F 3/245* (2013.01); *H03F 2200/102* (2013.01); *H03F 2200/321* (2013.01); *H03F 2200/451* (2013.01); *H04B 2001/0425* (2013.01)

(58) Field of Classification Search
CPC .......... H04B 1/04; H04B 17/11; H04B 17/13; H04B 17/15; H04B 17/16; H04B 2001/0425; H03F 3/195; H03F 3/213; H03F 1/3241; H03F 1/0216; H03F 2200/451; H03F 2200/102; G01R 31/2851; G01R 19/04
USPC ................ 375/224, 228, 259, 285, 295, 296
See application file for complete search history.

(56) References Cited

U.S. PATENT DOCUMENTS

| | | | | |
|---|---|---|---|---|
| 5,956,289 | A * | 9/1999 | Norman .................... | G11C 7/22 365/164 |
| 9,042,848 | B2 * | 5/2015 | Collados Asensio ..... | H03F 1/02 375/297 |
| 2014/0169427 | A1* | 6/2014 | Asensio .................... | H03F 1/02 375/224 |
| 2014/0194080 | A1* | 7/2014 | Li ........................... | H03F 1/025 455/226.1 |
| 2015/0326327 | A1* | 11/2015 | Carlsson ............... | H03F 1/0222 375/224 |

* cited by examiner

*Primary Examiner* — Siu Lee
(74) *Attorney, Agent, or Firm* — Han IP Corporation; Andy M. Han (57) ABSTRACT

Techniques and examples pertaining to variation calibration for envelope tracking on chip are described. Envelope tracking (ET) statistics among multiple wireless-capable mobile devices (e.g., smartphones) may be collected in laboratory. Optimal ET parameters may be determined based on ET statistics. An ET setting file may be generated for ET factory calibration. In production lines, the ET setting file may be loaded into each mobile device for ET factory calibration.

20 Claims, 6 Drawing Sheets

PERFORM A COMPREHENSIVE CALIBRATION MATRIX ACROSS A PLURALITY OF SAMPLE CHIPS EACH HAVING A CIRCUIT DESIGN IDENTICAL TO THAT OF A SEMICONDUCTOR CHIP TO DETERMINE A PLURALITY OF SETTING VALUES
605

COLLECT ENVELOPE TRACKING (ET) STATISTICS AMONG THE PLURALITY OF SAMPLE CHIPS
610

DETERMINE A PLURALITY OF ET PARAMETERS BASED ON THE ET STATISTICS
620

GENERATE A UNIVERSAL SETTING FILE FOR THE PLURALITY OF SAMPLE CHIPS BASED ON THE PLURALITY OF ET PARAMETERS
630

FIG. 6

VARIATION CALIBRATION FOR ENVELOPE TRACKING ON CHIP

CROSS REFERENCE TO RELATED PATENT APPLICATIONS

The present disclosure claims the priority benefit of U.S. Patent Application Ser. No. 62/212,816, filed on 1 Sep. 2015, which is incorporated by reference in their entirety.

TECHNICAL FIELD

The present disclosure is generally related to circuit calibration and, more particularly, to variation calibration for envelope tracking on chip.

BACKGROUND

Unless otherwise indicated herein, approaches described in this section are not prior art to the claims listed below and are not admitted to be prior art by inclusion in this section.

Due to the rapid evolution of wireless technology and the increasing demand for higher data rates, modulation schemes employed in wireless communications are becoming ever more complicated. Complex modulation schemes generate transmit signals with high peak-to-average ratios (PAPR) which degrade the efficiency of radio-frequency (RF) power amplifiers (PA). The situation becomes severer when more bands are required in Long Term Evolution (LTE) services. RF PAs tend to function less efficiently when they are configured to cover a wider frequency range. Moreover, services based on LTE Advanced (LTE-A) with carrier aggregation (CA) command more complicated RF front-end components that are accompanied with more insertion losses pushing RF PAs to output higher power which may be infeasible for conventional RF PAs with fixed supply voltage.

To address this issue, an envelope tracking (ET) technique has been proposed. With ET, the envelope of the actual modulated RF signal is tracked. By instantaneously adjusting the PA supply voltage according to the envelope of the modulated signal, ET can effectively reduce the power consumption of PA and, therefore, significantly improve the overall system efficiency. Recognizing the ability of ET in efficiency improvement, many smartphone vendors have adopted ET in their smartphones. Besides gallium arsenide (GaAs) PAs, ET is also useful in improving linearity and efficiency of complementary metal-oxide-semiconductor (CMOS) PAs that are widely used in WiFi applications.

ET calibration in factories typically considers electrical characteristics such as error vector magnitude (EVM), adjacent channel leakage ratio (ACLR), receive-band noise (RXBN) and power efficiency. However, due to the limited calibration time in production lines in a factory, it is difficult to calibrate good or optimal ET parameters. For instance, in production lines, the total time for measuring transmitter (TX) performance for one test condition is about 1 second. Specifically, a test computer controls a mobile device (e.g., a smartphone) to transmit TX signals to a test instrument, and the test computer obtains TX measurement results from the test instrument. It usually takes a long time for ET factory calibration to find optimal ET parameters (e.g., constant gain mapping, non-constant gain mapping, ET-TX path delay and so on) because of tradeoff among main performance indexes in terms of EVM, ACLR, RXBN and power efficiency. However, a desirable calibration time would be too long and unacceptable for production lines in the factory setting.

SUMMARY

The following summary is illustrative only and is not intended to be limiting in any way. That is, the following summary is provided to introduce concepts, highlights, benefits and advantages of the novel and non-obvious techniques described herein. Select and not all implementations are further described below in the detailed description. Thus, the following summary is not intended to identify essential features of the claimed subject matter, nor is it intended for use in determining the scope of the claimed subject matter.

The present disclosure provides new ET testing methodologies in laboratory to support ET factory calibration. Implementations in accordance with the present disclosure provide optimal ET parameters for ET factory calibration. Moreover, ET factory calibration may be sped up with implementations in accordance with the present disclosure.

According to one example implementation, a method of calibrating a plurality of parameters of a semiconductor chip implementable in a wireless communication device is provided. The method may involve performing a first calibration to calibrate a first set of parameters of the plurality of parameters. The method may also involve loading a universal setting file comprising a plurality of setting values for a second set of parameters of the plurality of parameters. The method may further involve performing a second calibration to calibrate the second set of parameters. The plurality of setting values may be predetermined by performing a comprehensive calibration matrix across a plurality of sample chips. The plurality of setting values may serve as initial calibration values for the second set of parameters.

According to another example implementation, a method may involve performing a comprehensive calibration matrix across a plurality of sample chips to determine a plurality of setting values. In performing the comprehensive calibration matrix across the plurality of sample chips, the method may involve collecting ET statistics among the plurality of sample chips; determining a plurality of ET parameters based on the ET statistics; and generating a universal setting file for the plurality of sample chips based on the plurality of ET parameters.

According to another example implementation, a variation calibration apparatus that calibrates a plurality of ET parameters for a plurality of semiconductor chips having a same circuit design including a transmitter (TX) is provided. The apparatus may include the following: a receptacle capable of receiving and operating each of the plurality of semiconductor chips one at a time; a variable power supply capable of setting a supply voltage through the receptacle for a respective semiconductor chip of the plurality of semiconductor chips received in the receptacle; a test instrument capable of measuring electrical characteristics of the respective semiconductor chip; a memory; and a processor communicatively coupled to the receptacle, the variable power supply, the test instrument, and the memory. The processor may be capable of performing an ET measurement for each of the plurality of semiconductor chips under one or more of a plurality of measurement conditions and under each of the plurality of ET setting combinations. The processor may be capable of analyzing the statistics database of the respective result of the ET measurement to determine a respective universal ET setting combination for each of one or more measurement conditions. The processor may be also capable of generating an ET setting file comprising one or more respective universal ET setting combinations for the one or more measurement conditions. The memory may store a plurality of components executable by the processor, such as a plurality of ET setting combinations based on the plurality of ET parameters, with each of the ET parameters having respective one or more ET parameter settings, and a respective result of the ET measurement for each of the plurality of semiconductor chips.

BRIEF DESCRIPTION OF THE DRAWINGS

The accompanying drawings are included to provide a further understanding of the disclosure, and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION

Overview

In the following detailed description, numerous specific details are set forth by way of examples in order to provide a thorough understanding of the relevant teachings. Any variations, derivatives and/or extensions based on teachings described herein are within the protective scope of the present disclosure. In some instances, well-known methods, procedures, components, and/or circuitry pertaining to one or more example implementations disclosed herein may be described at a relatively high level without detail, in order to avoid unnecessarily obscuring aspects of teachings of the present disclosure.

The proposed methodologies of the present disclosure speeds up ET factory calibration in production lines. Implementations of the proposed methodologies in accordance with the present disclosure may involve a number of tasks. For instance, ET statistics among multiple wireless-capable mobile devices (e.g., smartphones) may be collected in a laboratory or a non-production line setting. For instance, in a laboratory, required statistics among multiple mobile devices may be collected using modulated signals. Optimal ET parameters may be determined based on ET statistics. An ET setting file may be generated for ET factory calibration. In a factory or a production line setting, the ET setting file may be loaded into each mobile device for ET factory calibration. For instance, in a factory, each mobile device may be loaded with the setting file and may undergo factory calibration using non-modulated signals.

Present semiconductor technologies have facilitated production of many identical semiconductor chips or dies at one time. For example, a 300-mm diameter wafer can hold about 150 dies with each die having a size of 20 mm×20 mm, which is big enough for a complicated system such as a microprocessor of a personal computer. For smaller system-on-chips such as transceivers used in cell phones, smartphones or handsets, a wafer can easily hold thousands or even tens of thousands of identical dies. Semiconductor manufacturers, or "chip makers", are thus able to produce millions of semiconductor chips based on a same circuit design. Since the millions of chips produced are having the same circuit design, ideally they should be identical to each other, and therefore should perform identically in all circumstances. In reality, however, mass-produced chips often times do not perform exactly the same. Various manufacturing gradients introduced in the manufacturing processes may lead to so-called part-to-part "process variations" among the millions of chips produced. In addition, even for one of the millions of chips produced, the circuit thereon may not perform the same under various conditions, such as different supply voltages and/or ambient temperatures. Namely, a semiconductor chip may in itself be subjected to various "voltage variations" and/or "temperature variations". Collectively, the millions of supposedly identical semiconductor chips may exhibit various process-voltage-temperature (PVT) variations among them, making them slightly different from each other.

Numerous ways exist to battle the PVT variations. Pertinent to the present disclosure, a circuit may be designed with a few tunable or programmable parameters that allow the chip maker to individually adjust or tune for each chip after they are manufactured. In other words, the circuit may be designed to have a few "knobs" which may be set by a user to adjust certain characteristics of the circuit after a chip of the circuit is manufactured. Each of the "knobs" may be provided with one or more predetermined values, or "settings", for the user to choose from. The after-manufacturing process of tuning the circuit parameters for each chip is usually called "calibration". That is, each chip is to be respectively calibrated, and the circuit parameters of the respective chip are tuned to the right values such that it is able to perform the same or at least within a specification of the circuit design as others of the millions of chips manufactured.

The calibration may be a time-consuming process, especially if there are many "modes" in which the chip is designed to operate. The circuit parameters have to be tuned for each mode, as the chip may require a different set of parametric values to operate in each respective mode. The calibration process would find the corresponding set of parametric values for each mode, and save the calibrated parametric values into a database or look-up table (LUT). When required to operate in a certain mode, the chip may then refer to this database or LUT to find the appropriate set of parametric values therein to use for the mode.

A transceiver, having a transmitter (TX) and a receiver (RX), used in a LTE system usually has multiple modes in which the transceiver operates. Specifically, the transceiver may operate over as many as 50 bands, with each band having a different frequency range of signal. Each band may be further divided into several sub-bands, and each sub-band may be configured to operate with many channel bandwidth (CBW) candidates. Each CBW candidate may correspond to one or more bandwidth configurations. Considering all the band/sub-band/CBW/bandwidth configuration combinations, there may be as many as thousands of different modes in which the LTE transceiver may operate. For each of the thousands of different modes, a set of circuit parameters may be determined in the calibration process, which is a lengthy process. This is especially so when the TX of the transceiver is designed with ET capability. Unlike other circuit parameters, the calibration of ET parameters is performed in a more complicated equipment setup. Specifically, it usually requires a variable power supply setting a supply voltage for the chip being calibrated, and one or more measurement instruments measuring various in-band and out-band transmission characteristics. Typically, a measurement for a specific band/sub-band/CBW/bandwidth configuration combination may take as long as 1 second. Therefore, it could take thousands of seconds, or more than 100 minutes, to calibrate a chip of LTE TX with ET capability.

The number of modes for which calibration is needed may be further multiplied by the fact that the transceiver may operate at different temperatures with different transmitted RF power. That is, the transceiver may need a different set of parametric values when operating at different temperatures, and/or with different RF power. With all these dimensions (i.e., band, sub-band, CBW, bandwidth configuration, temperature and RF power) under which the circuit parameters are to be calibrated, the calibration matrix becomes very large. The time needed for performing the calibration according to such an extensive calibration matrix is thus very long that it is impractical to perform such a full-fledged calibration for each of the millions of chips manufactured.

Figure 1:
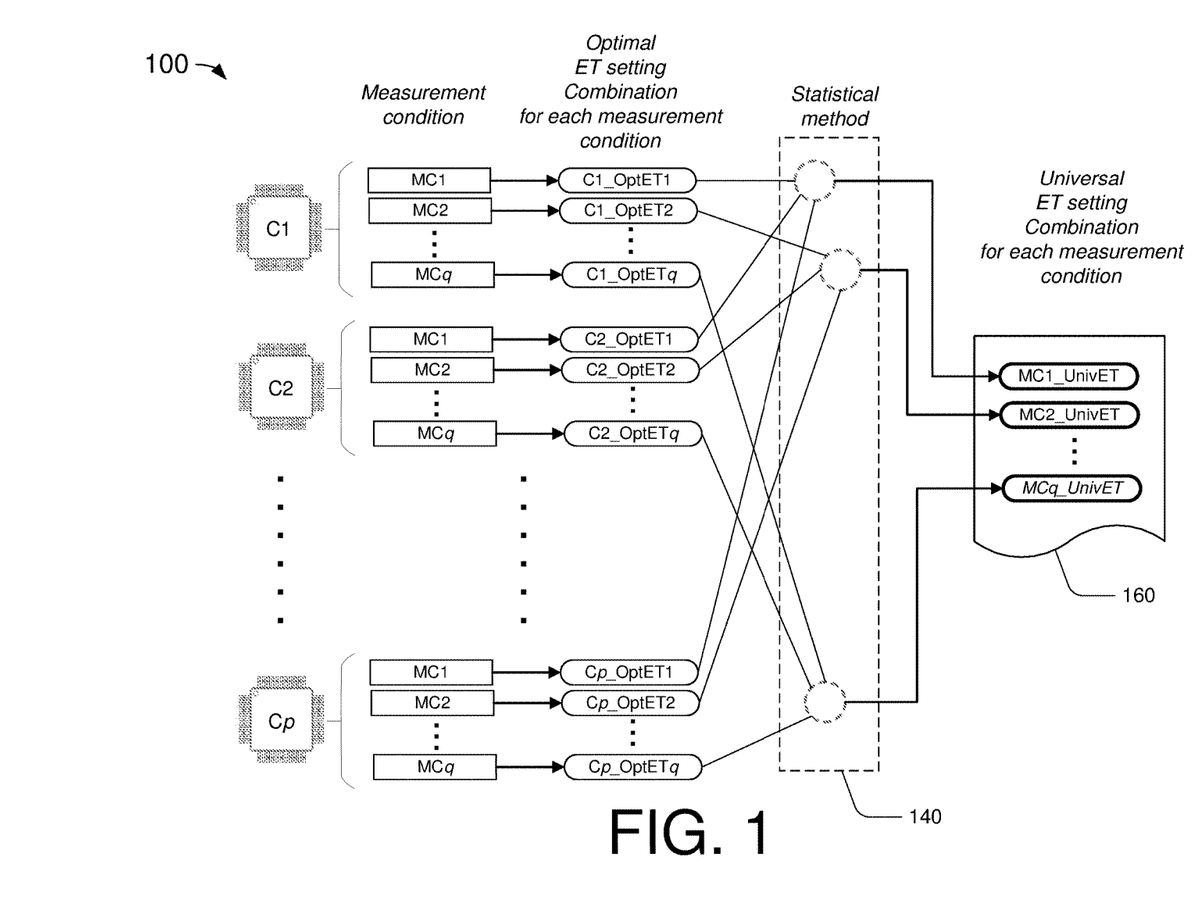
FIG. 1 is a diagram of an example scenario in which various techniques in accordance with the present disclosure may be implemented.

To address this issue, instead of calibrating all chips, the present disclosure proposes an improved methodology to calibrate a number of representative samples of chips for the ET parameters, and determine a universal set of ET parameters that apply to all chips. FIG. 1 depicts an example scenario 100 in which various techniques in accordance with the present disclosure may be implemented. In scenario 100, an example data flow showing an improved calibration methodology for a TX with ET capability in accordance with the present disclosure is shown. As described above, a set of ET parametric values is to be determined for each mode of the TX. In order to do this, the TX is to be placed under each of the modes (denoted by the measurement conditions, i.e., MC1, MC2, . . . , MCq, in FIG. 1), one mode after another. The parameter q indicates the number of modes.

As described above, the circuit parameters are analogized to knobs via which certain characteristics of the circuit can be adjusted, and each knob may be set to one of a few settings as designed. In the case of the TX with ET capability, there may be more than one ET parameters to be set, and each ET parameter may have one or more values or settings that can be chosen. In some implementations, the TX may include a knob called "ET gain mapping" with three settings, a knob called "digital pre-distortion (DPD) function with two settings, a knob called "PA bias voltage" with four settings, and a knob called "PA bias current" with two settings. It follows that there may be as many as 48 (i.e., 3×2×4×2=48) different combinations of possible ET parametric values, or 48 different combinations of ET settings, or ET setting combinations. One of the tasks of calibration is to determine which one of the 48 possible ET parameter setting combinations would serve best (e.g., as an optimal ET setting combination) for each of numerous measurement conditions. The ET settings may include at least, for example and without limitation, constant gain mapping, non-constant gain mapping, ET shaping function, DPD function and PA gate bias setting.

By some criteria and a decision-making methodology, to be described below, an optimal ET setting combination is decided for each measurement conditions. In the example shown in FIG. 1, it may be determined that one out of the 48 possible ET setting combinations is determined to be optimal for chip C1 under measurement condition MC1, denoted as C1_OptET1 in FIG. 1. In addition, one out of the 48 possible ET setting combinations may also be determined to be optimal for chip C1 under another measurement condition MC2, denoted as C1_OptET2 in FIG. 1. Similarly, for the rest of the numerous measurement conditions, an optimal ET setting combination may be determined.

This calibration process may be repeated for a few sample chips that are representative of the millions of chips produced in terms of the PVT variations. The number of sample chips C1-Cp (denoted by subscript p in FIG. 1) may vary, depending on how much effort is to be devoted to the calibration. In general, the greater the number of sample chips is, the more representative the sample chips may be, and the better the calibrated parameters may fit all chips. After the calibration is performed for all measurement conditions for all sample chips, a statistical method (shown as 140 in FIG. 1) may be employed to determine a "golden", or universal ET setting combination for each measurement condition based on the calibrated optimal ET setting combinations for the sample chips. This universal ET setting combination may be directly applied to all chips as the calibrated parametric values for the respective measurement condition, or the corresponding "mode". As shown in FIG. 1, for a mode denoted by measurement condition MC1, chip C1 may be calibrated to have an optimal ET setting combination C1_OptET1, chip C2 may be calibrated to have an optimal ET setting combination C2_OptET1, and so on. Statistical method 140 may then generate an universal ET setting combination MC1_UnivET based on C1_OptET1, C2_OptET1, . . . , and Cp_OptET1. Similarly, statistical method 140 may generate a universal ET setting combination MC2 UnivET based on C1_OptET2, C2_OptET2, . . . , and Cp_OptET2. Likewise, statistical method 140 may also generate a universal ET setting combination for the remainder of the numerous modes, or measurement conditions. The universal ET setting combinations may then be compiled into a single ET setting file 160 as shown in FIG. 1, which may be applied to or otherwise loaded into all chips manufactured.

Example Methodologies

Figure 2:
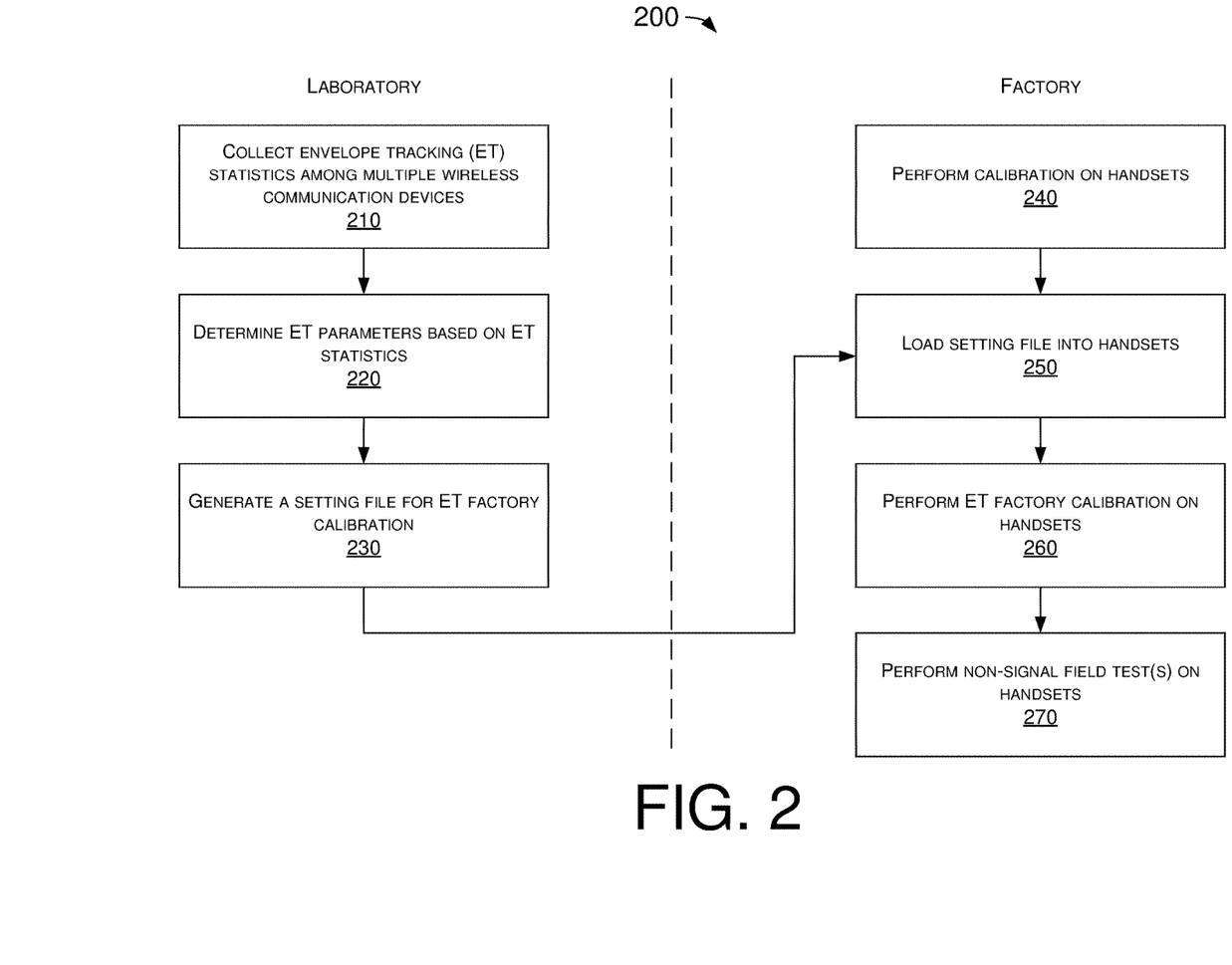
FIG. 2 is a flowchart of an example methodology in accordance with an implementation of the present disclosure.

FIG. 2 depicts an example methodology 200 in accordance with an implementation of the present disclosure. Methodology 200 may involve a number of operations (shown as blocks 210, 220 and 230) carried on in a laboratory or a non-production line setting. Additionally, methodology 200 may involve a number of operations (shown as blocks 240, 250, 260 and 270) carried out in a factory or a production-line setting. The operations carried out in the laboratory or non-production line setting pertain to the relatively lengthy and time-consuming measurement and calibration procedures described above with respect to scenario 100. That is, the time-consuming procedures related to obtaining optimal ET setting combinations may be carried out in a laboratory or a non-production line setting to result in a setting file (interchangeably referred to as "ET setting file" and "universal setting file" herein), which may be loaded into each device under test (e.g., semiconductor chips used in wireless communication devices, or handsets, such as cell phones and smartphones) in a factory or a production line setting. Advantageously, methodology 200 provides optimal ET parameters for ET factory calibration as well as speeds up ET factory calibration.

Referring to FIG. 2, on the laboratory or non-production line side, methodology 200 may begin at block 210.

At 210, methodology 200 may involve collecting ET statistics among multiple wireless communication devices (e.g., chips C1-Cp in scenario 100, with each of chips C1-Cp having an identical circuit design of a transmitter, or at least circuit(s) that is/are to be calibrated for each of chips C1-Cp is/are identical). Methodology 200 may proceed from 210 to 220.

At 220, methodology 200 may involve determining ET parameters based on the collected ET statistics. Methodology 200 may proceed from 220 to 230.

At 230, methodology may involve generating a setting file (e.g., an ET setting file or a universal setting file described herein) to be used in ET factory calibration (e.g., in the factory or production line setting), at block 250 as described below.

Referring to FIG. 2, on the factory or production line side, methodology 200 may begin at block 240.

At 240, methodology 200 may involve performing calibration on a plurality of wireless communication devices such as handsets (e.g., cell phones or smartphones). Methodology 200 may proceed from 240 to 250.

At 250, methodology 200 may involve loading the setting file into each of the plurality of wireless communication device under calibration. Methodology 200 may proceed from 250 to 260.

At 260, methodology 200 may involve performing ET factory calibration on each of the plurality of wireless communication devices. Methodology 200 may proceed from 260 to 270.

At 270, methodology 200 may involve performing one or more non-signal field tests each of the plurality of wireless communication devices.

Figure 3:
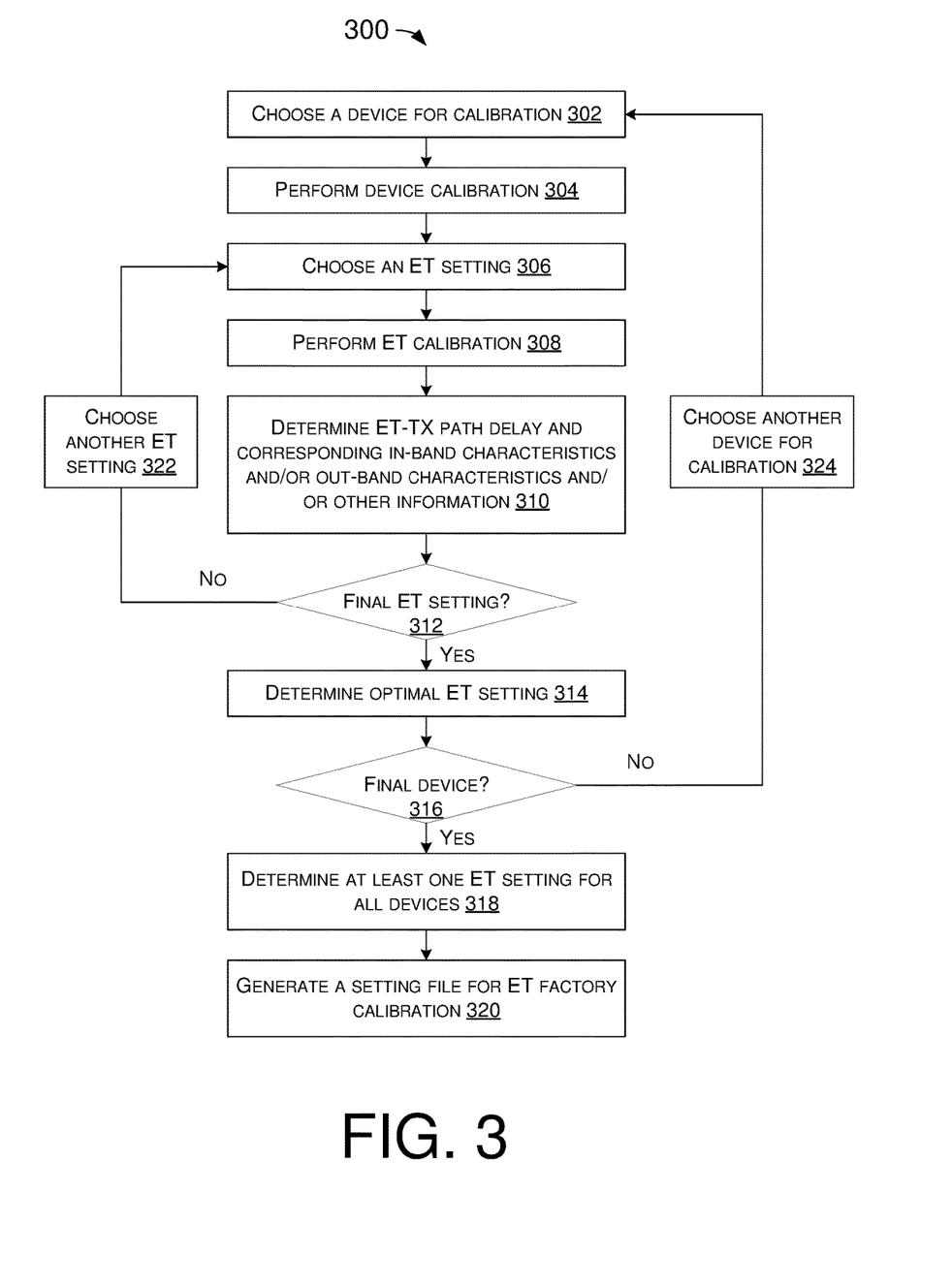
FIG. 3 is a flowchart of an example methodology in accordance with an implementation of the present disclosure.

FIG. 3 depicts an example methodology 300 pertaining to collection of ET statistics among wireless communication devices in accordance with an implementation of the present disclosure. Methodology 300 may be an example implementation of blocks 210, 220 and 230 of methodology 200. Referring to FIG. 3, methodology 300 may involve a number of operations (shown as blocks 302, 304, 306, 308, 310, 312, 314, 316, 318, 320, 322 and 324). Methodology 300 may begin at 302.

At 302, methodology 300 may involve choosing a device from multiple devices for calibration (e.g., chips C1-Cp). Methodology 300 may proceed from 302 to 304.

At 304, methodology 300 may involve performing device calibration on the chosen device. Methodology 300 may proceed from 304 to 306.

At 306, methodology 300 may involve choosing an ET setting from a number of ET settings for the device. Methodology 300 may proceed from 306 to 308.

At 308, methodology 300 may involve performing ET calibration under a variety of conditions for the device. Methodology 300 may proceed from 308 to 310.

At 310, methodology 300 may involve determining ET-TX path delay. As ET-TX path delay is a function of in-band characteristics, out-band characteristics and/or other information, methodology 300 may also involve determining in-band characteristics and/or out-band characteristics and/or other information (e.g., current and/or temperature) corresponding to the ET-TX path delay. In some implementations, at 310, methodology 300 may involve finding or searching for an optimal ET-TX path delay for all bands, sub-bands and CBWs. Additionally, methodology 300 may also involve recording the optimal ET-TX path delay and the corresponding ACLR, current, RXBN and/or EVM. In some implementations, a criterion for determining the optimal ET-TX path delay may be finding the ET-TX path delay having the best ACLR (e.g., one with a lowest value). In some implementations, a generalized criterion for determining the optimal ET-TX path delay may be a function of out-band emission, in-band linearity and/or temperature. Methodology 300 may proceed from 310 to 312.

At 312, methodology 300 may involve checking whether the current ET setting is the last or final ET setting among the number of ET settings. In an event that the current ET setting is the final ET setting, methodology 300 may proceed from 312 to 314. Otherwise, methodology may proceed from 312 to 322.

At 314, methodology 300 may involve determining an optimal ET setting for the device. An optimal ET setting is a function of all the ET statistics of all settings. In some implementations, a criterion for determining the optimal ET setting for each device may be finding the ACLR that passes a target ACLR with minimum current consumption. For instance, the optimal ET setting may be determined by finding the minimum current with the corresponding ACLR that passes the specification. In some implementations, a generalized criterion for determining the optimal ET setting for each device may be a function of ACLR, current, RXBN and/or EVM associated with the device. Alternatively or additionally, a generalized criterion for determining the optimal ET setting may be a function of out-band emission, in-band emission, current and/or temperature associated with the device. Methodology 300 may proceed from 314 to 316.

At 316, methodology 300 may involve checking whether the current device under calibration is the last or final device among the multiple devices for calibration. In an event that the current device is the final device, methodology 300 may proceed from 316 to 318. Otherwise, methodology may proceed from 316 to 324.

At 318, methodology 300 may involve determining at least one ET setting of the number of ET settings to be the universal ET setting for a batch of devices to be calibrated in a factory or a production line setting. The determined ET setting is a function of the ET setting(s) of the measured device and corresponding ET statistics. In some implementations, a criterion for determining the optimal ET setting for the batch of devices may be a mean gain mapping. For instance, an ET setting for all devices in the batch may be determined by averaging all the gain mapping values associated with the batch of devices. In some implementations, a generalized criterion for determining the optimal ET setting for the batch of devices may be a function of the ET settings of the batch of devices. Methodology 300 may proceed from 318 to 320.

At 320, methodology 300 may involve generating a setting file (e.g., ET setting file or universal setting file as described herein) for ET factory calibration. The setting file may include, for example and without limitation, at least some or all of the following information: ET-TX path delay, constant gain mapping, non-constant gain mapping, ET shaping function, DPD function, PA gate bias setting and temperature information. Solely for illustration purposed and without limiting the scope of the present disclosure, a simplified ET setting file for one band is shown in Table 1 below.

TABLE 1

|  | BW configuration 1 | BW configuration 2 | BW configuration 3 | ... | BW configuration m |
|---|---|---|---|---|---|
| BAND1_Subband1 | ET-TX path delay11 | ET-TX path delay12 | ET-TX path delay13 | ... | ET-TX path delay1m |
| BAND1_Subband2 | ET-TX path delay21 | ET-TX path delay22 | ET-TX path delay23 | ... | ET-TX path delay2m |
| ... | ... | ... | ... | ... | ... |
| BAND1_Subbandn | ET-TX path delayn1 | ET-TX path delayn2 | ET-TX path delayn3 | ... | ET-TX path delaynm |

At 322, methodology 300 may involve choosing another ET setting from the number of ET settings. Methodology 300 may proceed from 322 to 306.

At 324, methodology 300 may involve choosing another device from the multiple devices for calibration. Methodology 300 may proceed from 324 to 302.

Example Apparatus

Figure 4:
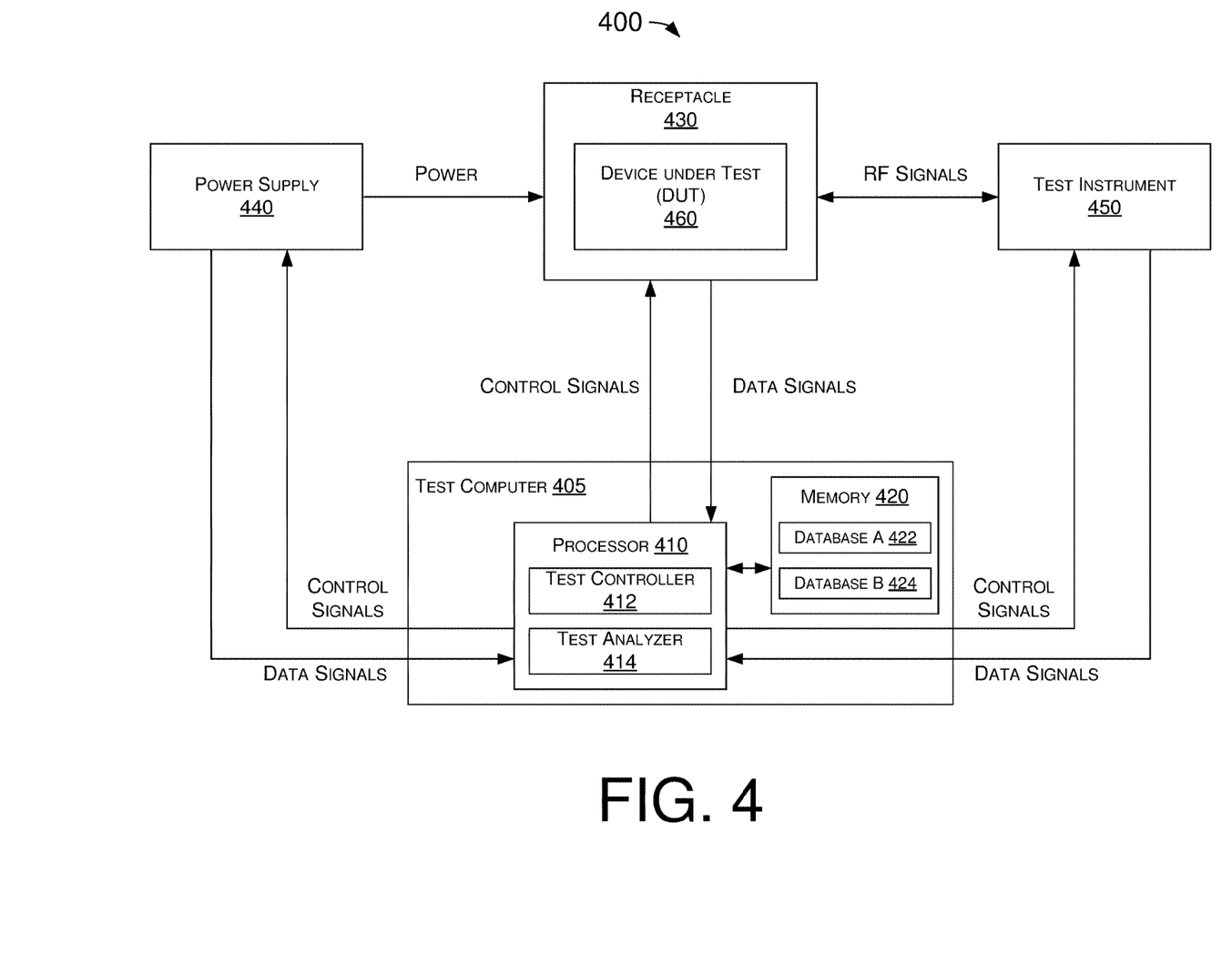
FIG. 4 is a simplified block diagram of an example variation calibration apparatus in accordance with an implementations of the present disclosure.

FIG. 4 depicts an example variation calibration apparatus 400 in accordance with an implementations of the present disclosure. Apparatus 400 may perform, execute or otherwise carry out various functions, tasks and/or operations related to concepts, techniques, schemes, solutions, scenarios, algorithms, approaches, processes and methods described herein, including example scenario 100, example methodology 200 and example methodology 300 described above as well as example process 500 and example process 600 described below. Apparatus 400 may include one, some or all of the components shown in FIG. 4. Apparatus 400 may optionally include additional component(s) not shown in FIG. 4. Such additional components are not relevant to the present disclosure, albeit necessary for the operation of apparatus 400, and thus are not shown in FIG. 4 so as to avoid obscuring the illustration.

Apparatus 400 may be a variation calibration apparatus that calibrates a plurality of ET parameters for a plurality of semiconductor chips having a same circuit design, with the circuit design including a transmitter (TX). In some implementations, apparatus 400 may be a variation calibration apparatus that calibrates a plurality of ET parameters for a plurality of semiconductor chips, wherein circuits to be calibrated within the plurality of semiconductor chips are identical and circuits that are not to be calibrated may not be identical. Apparatus 400 may include a test computer 405, a receptacle 430, a variable power supply 440 and a test instrument 450. Test computer 405 may include a processor 410 and a memory 420. Receptacle 430 may be capable of receiving and operating each of the plurality of semiconductor chips one at a time (shown as device under test (DUT) 460 in FIG. 4). Variable power supply 440 may be capable of setting a supply voltage through receptacle 430 for a respective semiconductor chip of the plurality of semiconductor chips received in receptacle 430. Test instrument 450 may be capable of measuring electrical characteristics of the respective semiconductor chip.

Memory 420 may be implemented by any suitable technology and may include volatile memory and/or non-volatile memory. For example, memory 420 may include a type of random access memory (RAM) such as dynamic RAM (DRAM), static RAM (SRAM), thyristor RAM (T-RAM) and/or zero-capacitor RAM (Z-RAM). Alternatively or additionally, memory 420 may include a type of read-only memory (ROM) such as mask ROM, programmable ROM (PROM), erasable programmable ROM (EPROM) and/or electrically erasable programmable ROM (EEPROM). Alternatively or additionally, memory 420 may include a type of non-volatile random-access memory (NVRAM) such as flash memory, solid-state memory, ferroelectric RAM (FeRAM), magnetoresistive RAM (MRAM) and/or phase-change memory.

Memory 420 may store a plurality of processor-executable components that are executable by processor 410. The processor-executable components may include an ET setting database 422 (shown as "database A" in FIG. 4) and a statistics database 424 (shown as "database B" in FIG. 4). ET setting database 422 may include a plurality of ET setting combinations based on the plurality of ET parameters, with each of the ET parameters having respective one or more ET parameter settings. Statistics database 424 may be programmed to store a respective result of an ET measurement for each of the plurality of semiconductor chips.

Processors 410 may be in the form of one or more integrated-circuit (IC) chips such as, for example and without limitation, one or more single-core processors, one or more multi-core processors, or one or more complex-instruction-set-computing (CISC) processors. Processor 410 may be communicatively coupled to receptacle 430, variable power supply 440, test instrument 450, and memory 420. That is, processor 410 may provide control signals to and/or receive data signals from each of receptacle 430, variable power supply 440 and test instrument 450, and processor 410 may access (e.g., write and read) data stored in memory 420.

Processor 410 may be a special-purpose computing device designed and configured to perform, execute or otherwise carry out specialized algorithms, software instructions, computations and logics to perform variation calibration for ET on semiconductor chips in accordance with the present disclosure. That is, processor 410 may include specialized circuits and/or hardware (and, optionally, specialized firmware) specifically designed and configured to perform variation calibration for ET on semiconductor chips in one or more novel ways not previously existing or available. As shown in FIG. 4, processor 410 may include a test controller 412 and a test analyzer 414.

Test controller 412 may be capable of performing a number of operations. For instance, test controller 412 may be capable of generating a measurement space which may include a plurality of measurement conditions based on a plurality of measurement vectors. Each of the measurement vectors may have respective one or more vector settings. Test controller 412 may be also capable of performing the ET measurement for each of the plurality of semiconductor chips. Specifically, test controller 412 may perform the ET measurement for each of the plurality of semiconductor chips by measuring the electrical characteristics of the respective semiconductor chip with a plurality of ET-TX path delay settings under one or more of the plurality of measurement conditions in the measurement space and under each of the plurality of ET setting combinations.

Test analyzer 414 may be capable of performing a number of operations. For instance, test analyzer 414 may be capable of analyzing statistics database 424 to determine a respective universal ET setting combination for each of one or more measurement conditions in the measurement space. Test analyzer 414 may be also capable of generating an ET setting file which may include one or more respective universal ET setting combinations for the one or more measurement conditions in the measurement space.

In some implementations, the electrical characteristics may include one or more of the following: an out-band emission, an in-band linearity, an error vector magnitude (EVM), an adjacent channel leakage ratio (ACLR), a receive-band noise (RXBN), a power efficiency, a current consumption, and a junction temperature.

In some implementations, the plurality of ET parameters may include one or more of the following: an ET gain mapping, a digital pre-distortion (DPD) function, a bias voltage of a power amplifier (PA) of the TX, and a bias current of the PA. Each of the plurality of ET setting combinations may include a respectively different combination of the plurality of ET parameters each set at one of the respective one or more ET parameter settings.

In some implementations, the plurality of measurement vectors may include a band, a sub-band, a CBW, and a bandwidth configuration. A respective one of the plurality of measurement conditions may include a respectively different combination of a setting of the band, a setting of the sub-band, a setting of the CBW, and a setting of the bandwidth configuration. The ET measurement under the respective one of the plurality of measurement conditions may be performed with a modulated RF signal modulated according to the setting of the band, the setting of the sub-band, the setting of the CBW, and the setting of the bandwidth configuration.

In some implementations, the plurality of measurement vectors may also include a RF power at an antenna of the TX. The respectively different combination may also include a setting of the RF power. The modulated RF signal may be further modulated to have a RF power associated with the setting of the RF power.

In some implementations, the plurality of measurement vectors may further include an ambient temperature. The respectively different combination may further include a setting of the ambient temperature. In such cases, receptacle 430 may include a temperature chamber configured to maintain the respective semiconductor chip (e.g., DUT 460) substantially at or about a temperature indicated by the setting of the ambient temperature of each of the one or more of the plurality of measurement conditions in the measurement space.

In some implementations, the respective result of the ET measurement may include a plurality of record entries of the electrical characteristics of the respective semiconductor chip. Each of the record entries may correspond to a respectively different ET setting combination under a respectively different measurement condition.

In some implementations, in determining the respective universal ET setting combination for each of the one or more measurement conditions, processor 410 may perform a number of operations. For instance, processor 410 may determine, based on a first predetermined criterion of one or more of the electrical characteristics, an optimal ET-TX path delay setting for each of the plurality of ET setting combinations under each of the one or more measurement conditions for each of the plurality of semiconductor chips. Processor 410 may also determine, based on a second predetermined criterion of one or more of the electrical characteristics, an optimal ET setting combination for each of the one or more measurement conditions for each of the plurality of semiconductor chips. Processor 410 may further determine, based on a statistical method across the plurality of semiconductor chips, the respective universal ET setting combination for each of the one or more measurement conditions.

In some implementations, the first predetermined criterion may include finding the optimal ET-TX path delay setting that has a target (e.g., lowest) ACLR value measured among the plurality of ET-TX path delay settings. In some implementations, the second predetermined criterion may include finding the optimal ET setting combination that achieves a target ACLR (e.g., an ACLR lower than a predetermined ACLR threshold) with a target (e.g. lowest) current consumption among the plurality of ET setting combinations.

In some implementations, the statistical method (e.g., statistical method 140) may include computing a mathematical average of the respective optimal ET setting combinations of the plurality of semiconductor chips.

Example Processes

Figure 5:
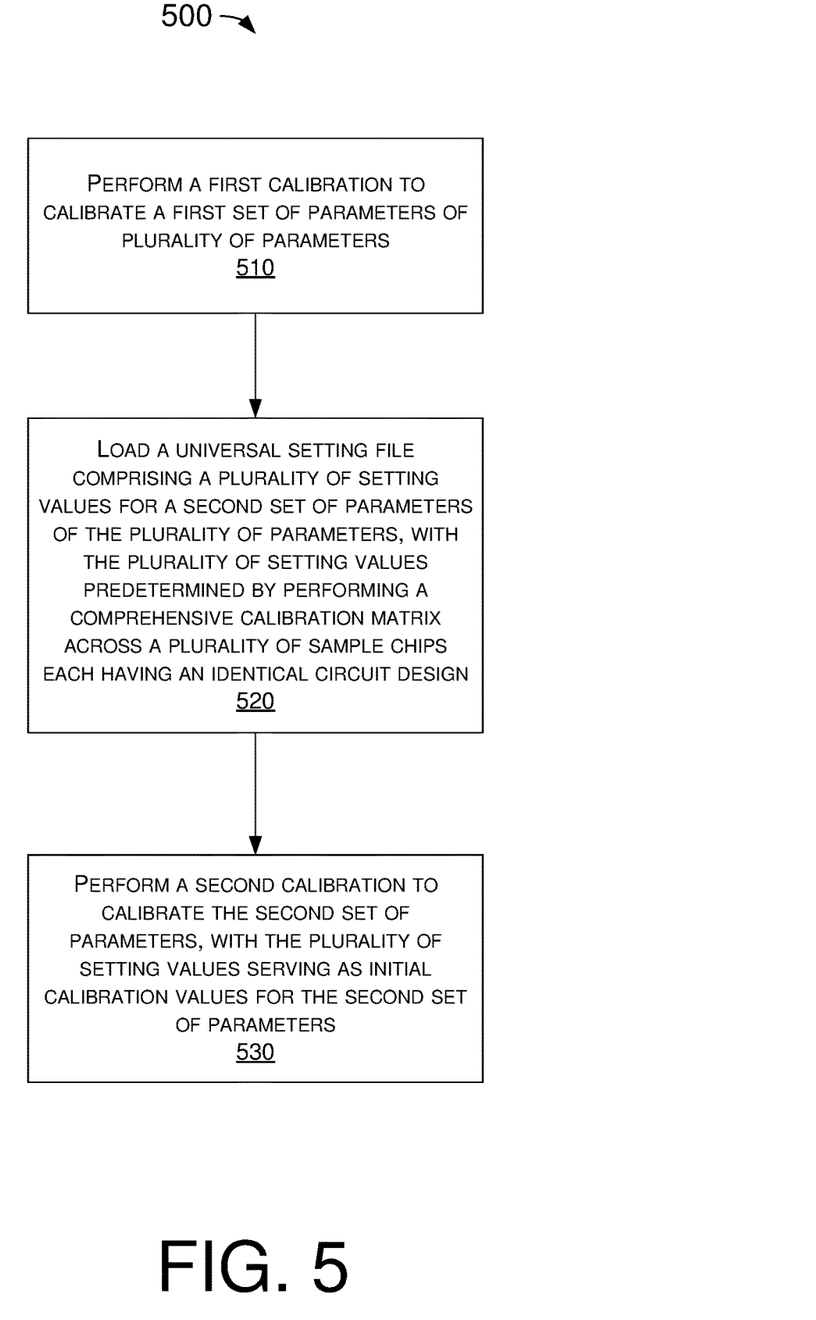
FIG. 5 is a flowchart of an example process pertaining to calibration of PVT variations for a plurality of parameters of a semiconductor chip implementable in a wireless communication device in accordance with an implementation of the present disclosure.

FIG. 5 depicts an example process 500 pertaining to calibration of PVT variations for a plurality of parameters of a semiconductor chip implementable in a wireless communication device in accordance with an implementation of the present disclosure. Process 500 may include one or more operations, actions, or functions as represented by one or more of blocks 510, 520 and 530. Although illustrated as discrete blocks, various blocks of process 500 may be divided into additional blocks, combined into fewer blocks, or eliminated, depending on the desired implementation. The blocks and sub-blocks of process 500 may be performed in the order shown in FIG. 5 or in any other order, depending on the desired implementation. Process 500 may be implemented by apparatus 400 and any variations and/or derivatives thereof. Process 500 may be an example implementation of each of methodology 200 and methodology 300, whether partially or completely. Solely for illustrative purposes and without limitation, process 500 is described below in the context of apparatus 400. Process 500 may begin at block 510.

At 510, process 500 may involve apparatus 400 performing a first calibration (for example, the handsets calibration 240 in FIG. 2) to calibrate a first set of parameters of the plurality of parameters. Process 500 may proceed from 510 to 520.

At 520, process 500 may involve apparatus 400 loading a universal setting file comprising a plurality of setting values for a second set of parameters of the plurality of parameters. The plurality of setting values may be predetermined by performing a comprehensive calibration matrix across a plurality of sample chips each having a circuit design identical to that of the semiconductor chip. Process 500 may proceed from 520 to 530.

At 530, process 500 may involve apparatus 400 performing a second calibration (for example, the ET factory calibration 260 in FIG. 2) to calibrate the second set of parameters. The plurality of setting values may serve as initial calibration values for the second set of parameters.

In some implementations, the circuit design may include a TX having an ET capability. The second set of parameters may include a plurality of ET parameters pertinent to the ET capability. In performing the comprehensive calibration matrix across the plurality of sample chips, process 500 may involve apparatus 400 applying modulated RF signals to a respective TX of each of the plurality of sample chips. In performing the second calibration, process 500 may involve apparatus 400 applying non-modulated RF signals to a respective TX of the semiconductor chip.

In some implementations, the plurality of ET parameters may include one or more of the following: an ET gain mapping, a digital pre-distortion (DPD) function, a bias voltage of a PA of the TX, and a bias current of the PA.

In some implementations, the TX may be configured to transmit a signal at one of a plurality of signal frequencies, with each of the plurality of signal frequencies denoted by a respectively different combination of a band setting, a sub-band setting, a CBW setting and a bandwidth configuration setting. The plurality of setting values of the universal setting file may include a respective set of initial calibration values for each of the plurality of signal frequencies.

In some implementations, the TX may be further configured to transmit the signal at one of a plurality of RF power levels. The respective set of initial calibration values may include a plurality of subsets of initial calibration values, with each of the plurality of subsets corresponding to a respective one of the plurality of RF power levels.

Figure 6:
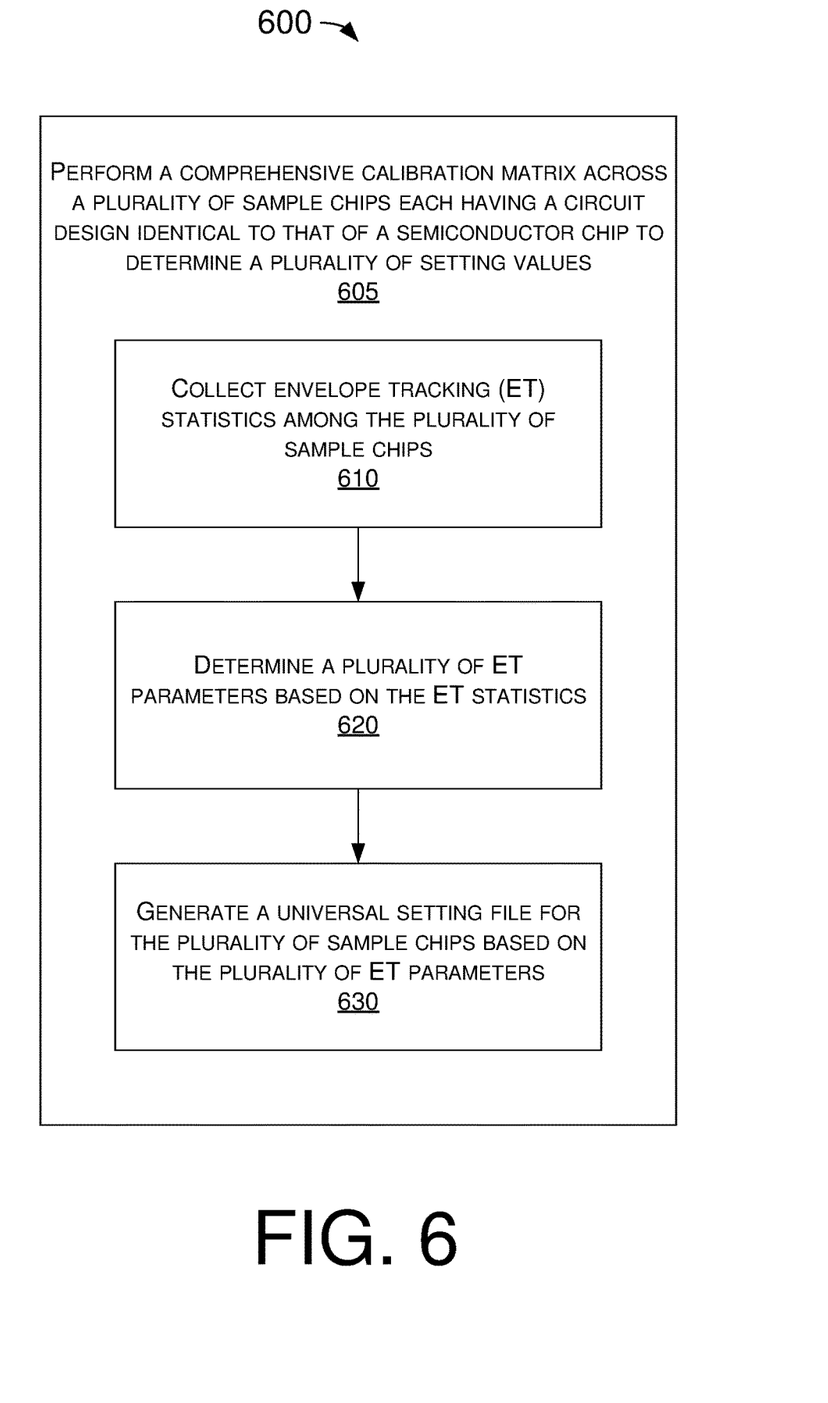
FIG. 6 is a flowchart of an example process pertaining to variation calibration for ET on chip in accordance with another implementation of the present disclosure.

FIG. 6 depicts an example process 600 pertaining to variation calibration for ET on chip in accordance with another implementation of the present disclosure. Process 600 may include one or more operations, actions, or functions as represented by one or more of block 605 and sub-blocks 610, 620 and 630. Although illustrated as discrete blocks, various blocks of process 600 may be divided into additional blocks, combined into fewer blocks, or eliminated, depending on the desired implementation. The blocks and sub-blocks of process 600 may be performed in the order shown in FIG. 6 or in any other order, depending on the desired implementation. Process 600 may be implemented by apparatus 400 and any variations and/or derivatives thereof. Process 600 may be an example implementation of each of methodology 200 and methodology 300, whether partially or completely. Solely for illustrative purposes and without limitation, process 600 is described below in the context of apparatus 400. Process 600 may begin at block 610.

At 610, process 600 may involve apparatus 400 performing a comprehensive calibration matrix across a plurality of sample chips to determine a plurality of setting values. Each of the sample chips may have a circuit design identical to that of a semiconductor chip. In performing the comprehensive calibration matrix across the plurality of sample chips, process 600 may involve apparatus 400 performing a number of operations as shown in sub-blocks 610, 620 and 630.

At 610, process 600 may involve apparatus 400 collecting ET statistics among the plurality of sample chips. Process 600 may proceed from 610 to 620.

At 620, process 600 may involve apparatus 400 determining a plurality of ET parameters based on the ET statistics. Process 600 may proceed from 620 to 630.

At 630, process 600 may involve apparatus 400 generating a universal setting file for the plurality of sample chips based on the plurality of ET parameters.

In some implementations, process 600 may also involve apparatus 400 performing a first calibration (for example, the device calibration 304 in FIG. 3) on a plurality of wireless communication devices, with each having a circuit design identical to that of the semiconductor chip, to calibrate a first set of parameters of the plurality of parameters. Additionally, process 600 may involve apparatus 400 loading the universal setting file into each of the plurality of wireless communication devices. The universal setting file may include the plurality of setting values for a second set of parameters of the plurality of parameters. Moreover, process 600 may involve apparatus 400 performing a second calibration on the plurality of wireless communication devices to calibrate the second set of parameters. The plurality of setting values may serve as initial calibration values for the second set of parameters.

In some implementations, the circuit design may include a TX having an ET capability. The second set of parameters may include at least some of the plurality of ET parameters pertinent to the ET capability. In performing the comprehensive calibration matrix across the plurality of sample chips, process 600 may involve apparatus 400 applying modulated RF signals to a respective TX of each of the plurality of sample chips. In performing the second calibration, process 600 may involve apparatus 400 applying non-modulated RF signals to a respective TX of the semiconductor chip.

In some implementations, the plurality of ET parameters may include one or more of the following: an ET gain mapping, a DPD function, a bias voltage of a PA of the TX, and a bias current of the PA. The TX may be configured to transmit a signal at one of a plurality of signal frequencies, with each of the plurality of signal frequencies denoted by a respectively different combination of a band setting, a sub-band setting, a CBW setting and a bandwidth configuration setting. The plurality of setting values of the universal setting file may include a respective set of initial calibration values for each of the plurality of signal frequencies. The TX may be further configured to transmit the signal at one of a plurality of RF power levels. The respective set of initial calibration values may include a plurality of subsets of initial calibration values, with each of the plurality of subsets corresponding to a respective one of the plurality of RF power levels.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A method of calibrating a plurality of parameters of a semiconductor chip implementable in a wireless communication device, the method comprising:
performing a first calibration to calibrate a first set of parameters of the plurality of parameters;
loading a universal setting file comprising a plurality of setting values for a second set of parameters of the plurality of parameters; and
performing a second calibration to calibrate the second set of parameters,
wherein the plurality of setting values are predetermined by performing a comprehensive calibration matrix across a plurality of sample chips, and
wherein the plurality of setting values serve as initial calibration values for the second set of parameters.

2. The method of claim 1, wherein:
each of the plurality of sample chips comprises a transmitter (TX) having an envelope tracking (ET) capability,
the second set of parameters comprises a plurality of ET parameters pertinent to the ET capability,
the performing of the comprehensive calibration matrix across the plurality of sample chips comprises applying modulated radio-frequency (RF) signals to a respective TX of each of the plurality of sample chips, and
the performing of the second calibration comprises applying non-modulated RF signals to a respective TX of the semiconductor chip.

3. The method of claim 2, wherein the plurality of ET parameters comprise one or more of an ET gain mapping, a digital pre-distortion (DPD) function, a bias voltage of a power amplifier (PA) of the TX, and a bias current of the PA.

4. The method of claim 2, wherein the TX is configured to transmit a signal at one of a plurality of signal frequencies, with each of the plurality of signal frequencies denoted by a respectively different combination of a band setting, a sub-band setting, a channel bandwidth (CBW) setting and a bandwidth configuration setting, and wherein the plurality of setting values of the universal setting file comprise a respective set of initial calibration values for each of the plurality of signal frequencies.

5. The method of claim 4, wherein the TX is further configured to transmit the signal at one of a plurality of RF power levels, and wherein the respective set of initial calibration values comprises a plurality of subsets of initial calibration values, with each of the plurality of subsets corresponding to a respective one of the plurality of RF power levels.

6. A method, comprising:
performing a comprehensive calibration matrix across a plurality of sample chips to determine a plurality of setting values, the performing comprising:
collecting envelope tracking (ET) statistics among the plurality of sample chips;
determining a plurality of ET parameters based on the ET statistics; and
generating a universal setting file for the plurality of sample chips based on the plurality of ET parameters.

7. The method of claim 6, wherein the universal setting file is loaded into device under test as initial calibration values for a factory calibration.

8. The method of claim 7, wherein:
the performing of the comprehensive calibration matrix across the plurality of sample chips comprises applying modulated radio-frequency (RF) signals to a respective TX of each of the plurality of sample chips, and
the performing of the factory calibration comprises applying non-modulated RF signals to a respective TX of the device under test.

9. The method of claim 8, wherein:
- the plurality of ET parameters comprise one or more of an ET gain mapping, a digital pre-distortion (DPD) function, a bias voltage of a power amplifier (PA) of the TX, and a bias current of the PA,
- the TX is configured to transmit a signal at one of a plurality of signal frequencies, with each of the plurality of signal frequencies denoted by a respectively different combination of a band setting, a sub-band setting, a channel bandwidth (CBW) setting and a bandwidth configuration setting,
- the plurality of setting values of the universal setting file comprise a respective set of initial calibration values for each of the plurality of signal frequencies,
- the TX is further configured to transmit the signal at one of a plurality of RF power levels, and
- the respective set of initial calibration values comprises a plurality of subsets of initial calibration values, with each of the plurality of subsets corresponding to a respective one of the plurality of RF power levels.

10. A variation calibration apparatus that calibrates a plurality of envelope tracking (ET) parameters for a plurality of semiconductor chips having a same circuit design, the circuit design comprising a transmitter (TX), the apparatus comprising:
- a receptacle capable of receiving and operating each of the plurality of semiconductor chips one at a time;
- a variable power supply capable of setting a supply voltage through the receptacle for a respective semiconductor chip of the plurality of semiconductor chips received in the receptacle;
- a test instrument capable of measuring electrical characteristics of the respective semiconductor chip;
- a memory storing a plurality of ET setting combinations based on the plurality of ET parameters, with each of the ET parameters having respective one or more ET parameter settings, and the memory also storing a respective result of an ET measurement for each of the plurality of semiconductor chips; and
- a processor communicatively coupled to the receptacle, the variable power supply, the test instrument, and the memory, the processor capable of performing operations comprising:
  - performing the ET measurement for each of the plurality of semiconductor chips under one or more of a plurality of measurement conditions and under each of the plurality of ET setting combinations; and
  - analyzing the respective result of the ET measurement to determine a respective universal ET setting combination for each of one or more measurement conditions, and generating an ET setting file comprising one or more respective universal ET setting combinations for the one or more measurement conditions.

11. The apparatus of claim 10, wherein the electrical characteristics comprise one or more of an out-band emission, an in-band linearity, an error vector magnitude (EVM), an adjacent channel leakage ratio (ACLR), a receive-band noise (RXBN), a power efficiency, a current consumption, and a junction temperature.

12. The apparatus of claim 10, wherein the plurality of ET parameters comprise one or more of an ET gain mapping, a digital pre-distortion (DPD) function, a bias voltage of a power amplifier (PA) of the TX, and a bias current of the PA, and wherein each of the plurality of ET setting combinations comprises a respectively different combination of the plurality of ET parameters each set at one of the respective one or more ET parameter settings.

13. The apparatus of claim 10, wherein a respective one of the plurality of measurement conditions comprises a respectively different combination of a setting of a band, a setting of a sub-band, a setting of a CBW, and a setting of a bandwidth configuration, and wherein the ET measurement under the respective one of the plurality of measurement conditions is performed with a modulated radio-frequency (RF) signal modulated according to the setting of the band, the setting of the sub-band, the setting of the CBW, and the setting of the bandwidth configuration.

14. The apparatus of claim 13, wherein the respectively different combination further comprises a setting of a RF power, and wherein the modulated RF signal is further modulated to have a RF power associated with the setting of the RF power.

15. The apparatus of claim 13, wherein the respectively different combination further comprises a setting of an ambient temperature, and wherein the receptacle comprises a temperature chamber configured to maintain the respective semiconductor chip substantially at or about a temperature indicated by the setting of the ambient temperature of each of the one or more of the plurality of measurement conditions in a measurement space.

16. The apparatus of claim 10, wherein the respective result of the ET measurement comprises a plurality of record entries of the electrical characteristics of the respective semiconductor chip, with each of the record entries corresponding to a respectively different ET setting combination under a respectively different measurement condition.

17. The apparatus of claim 10, wherein, in determining the respective universal ET setting combination for each of the one or more measurement conditions, the processor performs operations comprising:
- determining, based on a first predetermined criterion of one or more of the electrical characteristics, an optimal ET-TX path delay setting for each of the plurality of ET setting combinations under each of the one or more measurement conditions for each of the plurality of semiconductor chips;
- determining, based on a second predetermined criterion of one or more of the electrical characteristics, an optimal ET setting combination for each of the one or more measurement conditions for each of the plurality of semiconductor chips; and
- determining, based on a statistical method across the plurality of semiconductor chips, the respective universal ET setting combination for each of the one or more measurement conditions.

18. The apparatus of claim 17, wherein the first predetermined criterion comprises finding the optimal ET-TX path delay setting that has a target ACLR value measured among a plurality of ET-TX path delay settings.

19. The apparatus of claim 17, wherein the second predetermined criterion comprises finding the optimal ET setting combination that achieves a target ACLR with a target current consumption among the plurality of ET setting combinations.

20. The apparatus of claim 17, wherein the statistical method comprises computing a mathematical average of the respective optimal ET setting combinations of the plurality of semiconductor chips.

* * * * *